(12) United States Patent
Yu et al.

(10) Patent No.: US 12,244,293 B2
(45) Date of Patent: Mar. 4, 2025

(54) FILM BULK ACOUSTIC RESONATOR FILTER ASSEMBLING AND INTERCONNECTING METHOD AND ELECTRONIC DEVICE

(71) Applicant: NO. 26 RESEARCH INSTITUTE OF CHINA ELECTRONICS TECHNOLOGY GROUP CORPORATION, Chongqing (CN)

(72) Inventors: Huaiqiang Yu, Chongqing (CN); Lei Zhang, Chongqing (CN); Like Deng, Chongqing (CN); Xi Wang, Chongqing (CN); Bin Cheng, Chongqing (CN); Jinyi Ma, Chongqing (CN); Chuangxin Jiang, Chongqing (CN); Mingyan Jiang, Chongqing (CN); Shiyi Jiang, Chongqing (CN); Meirui Liu, Chongqing (CN); Xiao Peng, Chongqing (CN)

(73) Assignee: NO. 26 RESEARCH INSTITUTE OF CHINA ELECTRONICS TECHNOLOGY GROUP CORPORATION, Chongqing (CN)

(*) Notice: Subject to any disclaimer, the term of this patent is extended or adjusted under 35 U.S.C. 154(b) by 346 days.

(21) Appl. No.: 17/955,501

(22) Filed: Sep. 28, 2022

(65) Prior Publication Data
US 2023/0030644 A1    Feb. 2, 2023

Related U.S. Application Data

(63) Continuation of application No. PCT/CN2022/072462, filed on Jan. 18, 2022.

(51) Int. Cl.
*H03H 9/17* (2006.01)
*H03H 9/02* (2006.01)
(Continued)

(52) U.S. Cl.
CPC ........ *H03H 9/171* (2013.01); *H03H 9/02952* (2013.01); *H03H 9/542* (2013.01); *H03H 9/605* (2013.01)

(58) Field of Classification Search
CPC .... H03H 9/02952; H03H 9/542; H03H 9/171; G01R 33/00; G01R 33/0035;
(Continued)

(56) References Cited

U.S. PATENT DOCUMENTS 10,312,882 B2 *   6/2019 Qiu ..................... H01P 1/201
2017/0338799 A1 * 11/2017 Ruby ................... H03H 9/171
(Continued)

*Primary Examiner* — Jermele M Hollington
*Assistant Examiner* — Taqi R Nasir

(57) ABSTRACT

The disclosure provides a method for assembling and interconnecting FBAR filter and an electronic device. The method includes constructing an equivalent circuit model of an assembled FBAR filter according to a circuit model of a filter chip and the grounding circuit of the FBAR filter; modeling, simulating and calculating the grounding circuit to extract parasitic parameters corresponding to the grounding pad and a grounding bond-wire of the grounding circuit, respectively; feedbacking the parasitic parameters back into the equivalent circuit model, and using the circuit simulation software to obtain an S parameter of the filter; adjusting the parasitic parameters of the grounding circuit to optimize an S parameter performance of the FBAR filter: obtaining an optimal assembly configuration of the FBAR filter to guide the assembly. The parasitic parameters include a parasitic inductance of the grounding bond-wire and a parasitic capacitance and parasitic inductance of the grounding pad.

9 Claims, 4 Drawing Sheets

(51) Int. Cl.
*H03H 9/54* (2006.01)
*H03H 9/60* (2006.01)

(58) Field of Classification Search
CPC ............ G01R 33/0023; G01R 33/0017; G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

2019/0393860 A1\* 12/2019 Shih ................. H03H 9/564
2020/0403598 A1\* 12/2020 Turner ............... H03H 9/205

\* cited by examiner

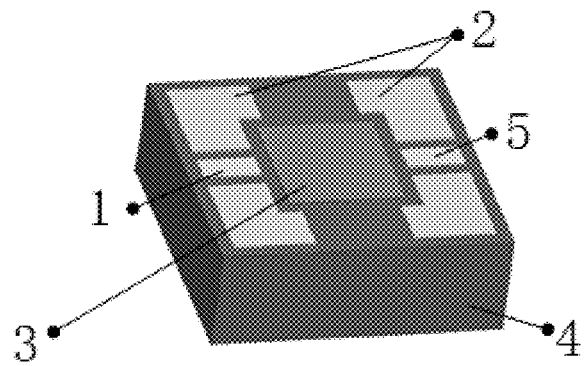
Figure 2
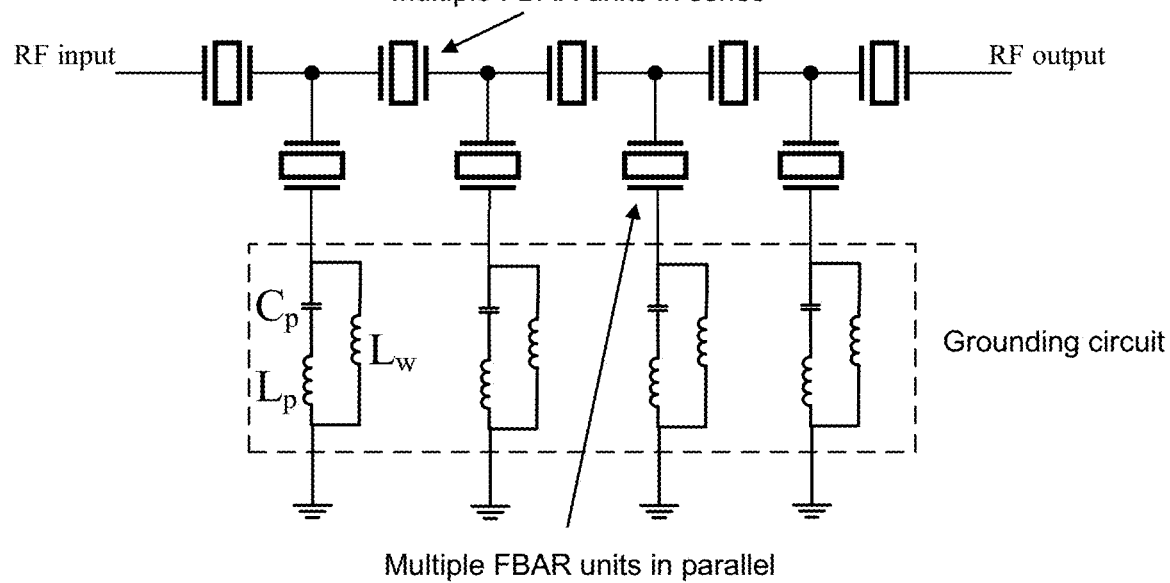
Figure 3-a
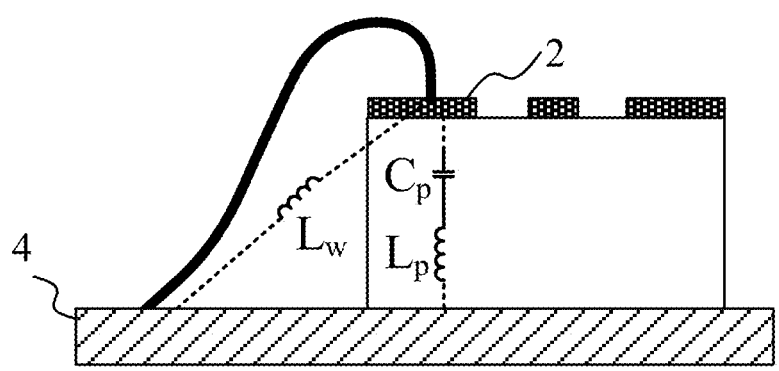
Figure 3-b

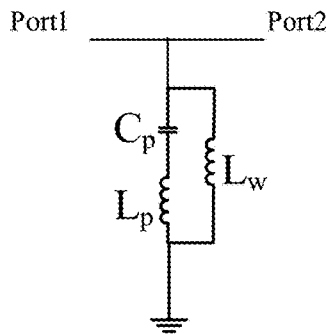
Parasitic parameter model of the grounding circuit
Figure 3-c
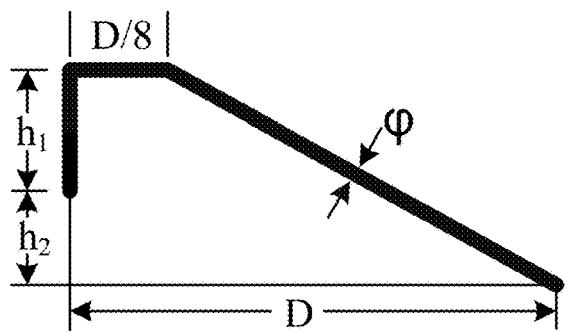
Figure 4-a
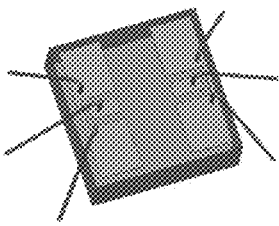
Figure 4-b
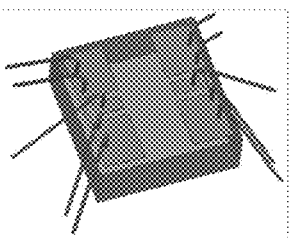
Figure 4-c
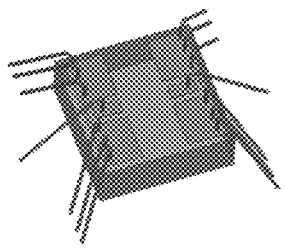
Figure 4-d

FILM BULK ACOUSTIC RESONATOR FILTER ASSEMBLING AND INTERCONNECTING METHOD AND ELECTRONIC DEVICE

CROSS REFERENCE TO RELATED APPLICATION

The present application is a continuation application of PCT Application No. PCT/CN2022/072462, filed on Jan. 18, 2022, which claims the benefit of priority to a Chinese Patent Application number CN 202110860347.3, filed on Jul. 27, 2021, the disclosure of the above application is hereby incorporated by reference in its entirety for all purposes.

TECHNICAL FIELD

The disclosure relates to radio frequency technology and filter technology, particularly to a method for assembling and interconnecting a film bulk acoustic resonator filter and a filter electronic device.

BACKGROUND

The multi-functional development of wireless communication terminals puts forward advanced technical requirements for radio frequency (RF) devices such as miniaturization, high frequency, high performance, low power consumption, low cost and so on. The conventional surface acoustic wave (SAW) filter has large insertion loss in the high frequency band above 2.4 GHz, and the dielectric filter has good performance but the size is too large. Film Bulk Acoustic Resonance (FBAR) filter technology is a kind of RF device with more superior performance that appears with the improvement of processing technology and the rapid development of modern wireless communication technology in recent years. It has a very high quality factor Q value (above 1000) and may be integrated on IC chips, and is compatible with the process of Complementary Metal Oxide Semiconductor (CMOS), which effectively avoids the disadvantage that the SAW resonator filter and the dielectric resonator filter may not be compatible with the process of the CMOS process.

At present, in the research, design and manufacture of FBAR filters, the electrical connection of the FBAR filters is usually realized by wire bonding on a silicon substrate. However, wire bonding has an impact on the out-band filtering performance of the FBAR filter, such as suppressing the transmission zero frequency of a particular interfering signal. At present, when the FBAR filter is wire-bonded and packaged, the target performance is often obtained by continuous adjusting the wire bonding configuration based on historical experience, which causes disadvantages such as heavy adjusting workloads, low working efficiency, undesignability and difficulty to achieve optimal performance, repeated adjustment for different filter and so on. Therefore, there is an urgent need for a method for assembling and interconnecting an FBAR filter that can achieve a specified filter performance and guide the parameters of the wire bonding and package.

SUMMARY

The disclosure provides a method for assembling and interconnecting a film bulk acoustic resonator (FBAR) filter and an FBAR filter electronic device, which is used to solve the problems such as heavy adjusting workloads, low working efficiency, undesignability and difficulty to achieve optimal performance, repeated adjustment for different filter and so on when the FBAR filter is assembled and used.

The disclosure provides the assembly and interconnecting method of the FBAR filter. The method includes:

S1: constructing an equivalent circuit model of an assembled FBAR filter according to a circuit model of a filter chip of the FBAR filter and a grounding circuit of the FBAR filter. The circuit model of the filter chip of the FBAR filter is simulated by a plurality of film bulk acoustic resonators in different architecture designs. The grounding circuit of the FBAR filter includes a parasitic capacitor of a grounding pad on the surface of the filter chip, a parasitic inductor of the grounding pad on the surface of the filter chip and a parasitic inductor of a grounding bond-wire. Each grounding circuit of the plurality of film bulk acoustic resonators are of same structure, and the grounding circuit is formed by connecting the parasitic capacitor and the parasitic inductor of the grounding pad in series and then to be connected in parallel with the parasitic inductor of the grounding bond-wire.

S2: modeling, simulating and calculating the grounding circuit of the FBAR filter to extract parasitic parameters corresponding to the grounding pad and the grounding bond-wire of the grounding circuit, respectively.

S3: feedbacking the parasitic parameters of the grounding circuit mentioned in S2 into the equivalent circuit model of the assembled FBAR filter mentioned in S1 and obtaining an S parameter of the FBAR filter by using a circuit simulation software.

S4: adjusting the parasitic parameters of the grounding circuit to optimize the S parameter performance of the FBAR filter.

S5: obtaining an optimal assembly configuration of the FBAR filter by comparing the S parameter performances of the FBAR filter with different assembly configurations to guide an assembly of the FBAR filter.

The disclosure in the other hand provides a filter electronic device, which includes the FBAR filter assembled by the method mentioned above.

In summary, the method for assembling and interconnecting the FBAR filter and the electronic device of the disclosure have the following beneficial effects:

The disclosure establishes an equivalent model for the FBAR filter with the parasitic inductors and the parasitic capacitor of the grounding circuit. Through simulating the filter with different configurations of grounding bond-wires, adjust the parasitic inductance of the grounding bond-wire to enable the FBAR filter to achieve the specified out-band suppression or an optimization of the passband bandwidth, so that the FBAR filter with a specified S parameter is obtained and an assembling efficiency and performance of the FBAR filter are improved. In addition, in a performance simulation work of FBAR filter, it provides an important theoretical basis for a realization of a device assembly.

BRIEF DESCRIPTION OF THE DRAWINGS

FIG. 2 is a schematic structural view of the FBAR filter chip based on a ladder topology structure according to an embodiment of the disclosure. Wherein, 1 is a first RF port of the filter chip, 2 is a grounding pad of the filter chip, 3 is a film bulk acoustic resonator area of the filter chip, 4 is a silicon substrate of the filter chip, and 5 is a second RF port of the filter chip.

FIG. 3-*a*, FIG. 3-*b*, FIG. 3-*c* are schematic views of the principle of the FBAR filter after connecting the grounding bond-wire according to an embodiment of the disclosure.

FIG. 4-*a*, FIG. 4-*b*, FIG. 4-*c*, FIG. 4-*d* are respectively simulation model views of the bond wire and the FBAR filters after connecting the grounding bond-wires according to an embodiment of the disclosure.

DETAILED DESCRIPTION

The following describes the implementation of the disclosure through specific embodiments, and those skilled in the art can easily understand other advantages and effects of the disclosure from the content disclosed in this specification. The disclosure may also be implemented or applied through other different specific embodiments. Various details in this specification may also be modified or changed based on different viewpoints and applications without departing from the disclosure. It should be noted that the following embodiments and features in the embodiments may be combined with each other under the conditions of no conflict.

It should be noted that figures provided in these embodiments only illustrate a basic idea of the disclosure in a schematic manner. The figures only show the assemblies related to the disclosure instead of drawing according to number, shape and size of the assemblies in actual implementation. In its actual implementation, type, quantity, and ratio of each assembly may be changed at will, and its assembly layout type may also be more complicated.

Film bulk acoustic resonator (FBAR) manufactured by using silicon MEMS (Micro Electromechanical System) technology utilizes the inverse piezoelectric effect of piezoelectric film material to convert electrical energy into acoustic waves, thus forming resonance. A working principle of FBAR is that in a core part of a "sandwich" structure including an electrode—a piezoelectric material—an electrode, when a voltage signal is applied to the electrodes, the piezoelectric material will be deformed. And if the signal is an alternative voltage, the sandwich structure will produce a vibration utilizing the inverse piezoelectric effect. In this process, electrical energy is converted into mechanical energy, which is propagated in the structure through acoustic waves. A vibration will also generate electrical signals, which means that through the piezoelectric effect, the mechanical energy is converted into the electrical energy and the signal is output. The piezoelectric effect and the inverse piezoelectric effect exist at the same time, interact with each other, and can generate resonance in a process of interaction, so as to select the signal.

ADS (Advanced Design System) is an EDA tool specially developed by Agilent. It is a simulation software for radio frequency (RF) microwave circuits and communication systems. With a powerful circuit simulation function of ADS, it is convenient for users to simulate FBAR quickly.

HFSS (High Frequency Structure Simulator) is a three-dimensional electromagnetic simulation software introduced by Ansoft. HFSS provides a simple and intuitive user design interface, an accurate and adaptive field solver, and a powerful post-processor with electrical property analysis capabilities, which can calculate an S parameter and a full-wave electromagnetic field of three-dimensional passive structures of any shape.

Figure 1:
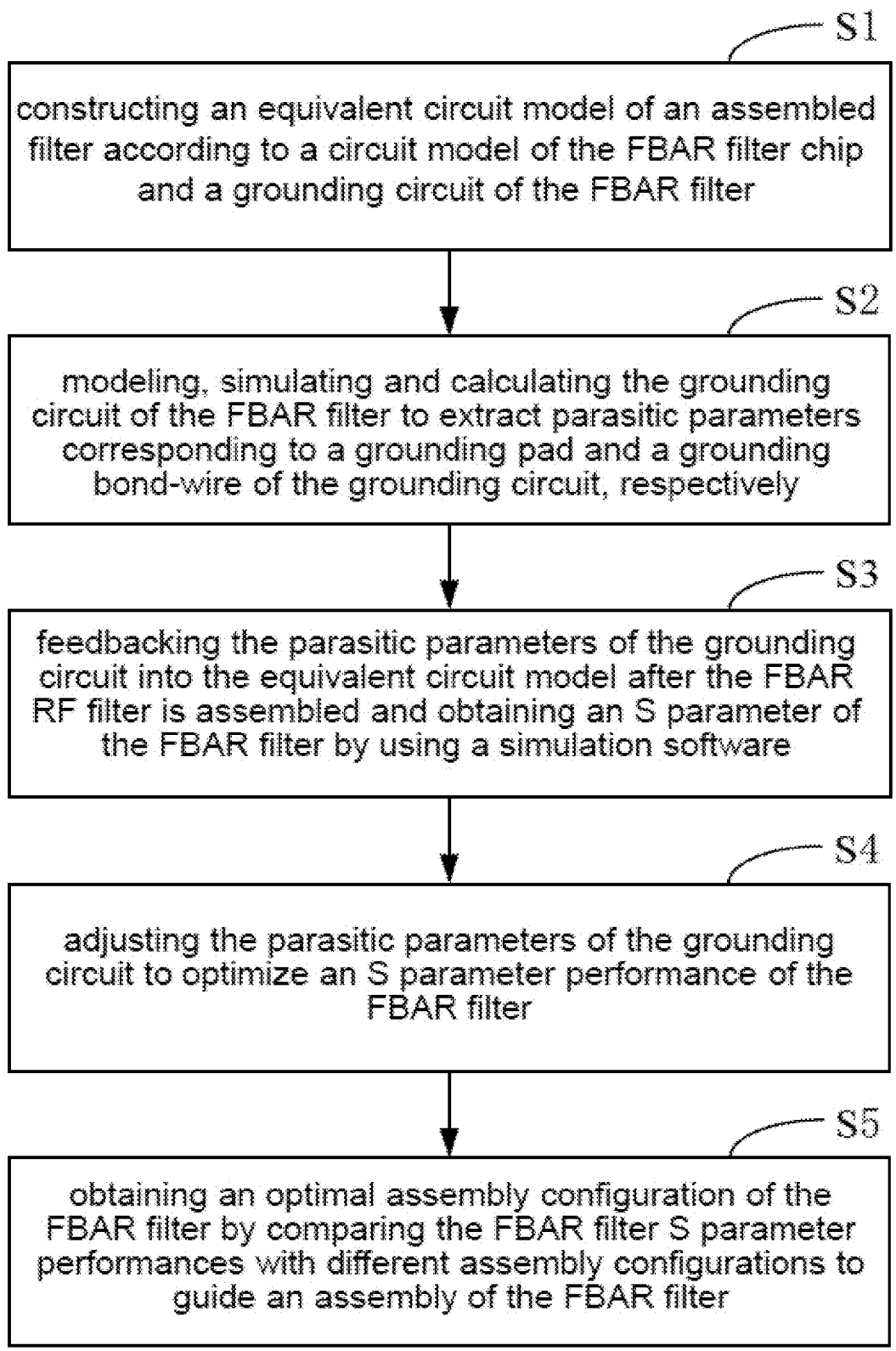
FIG. 1 is a flowchart of a method for assembling and interconnecting the FBAR filter according to an embodiment of the disclosure.

Please refer to FIG. 1. FIG. 1 is a flowchart of a method for assembling and interconnecting film bulk acoustic resonator (FBAR) filter. The assembling and interconnecting method of the FBAR filter includes:

S1: constructing an equivalent circuit model of an assembled FBAR filter according to a circuit model of a filter chip of the FBAR filter and a grounding circuit of the FBAR filter. The circuit model of the filter chip is simulated by a plurality of film bulk acoustic resonators in different architecture designs. The grounding circuit of the FBAR filter includes a parasitic capacitor of a grounding pad on a surface of the filter chip, a parasitic inductor of the grounding pad on the surface of the filter chip and a parasitic inductor of a grounding bond-wire. Each grounding circuit of the plurality of film bulk acoustic resonators are of the same structure, and the grounding circuit is formed by connecting the parasitic capacitor and the parasitic inductor of the grounding pad in series and then to be connected in parallel with the parasitic inductor of the grounding bond-wire. The assembled FBAR filter is from by connecting the plurality of film bulk acoustic resonators with the grounding circuits. Different architecture design/configurations refer to different parallel/series connections or the different number of the plurality of resonators.

S2: modeling, simulating and calculating the grounding circuit of the FBAR filter to extract parasitic parameters corresponding to the grounding pad and the grounding bond-wire of the grounding circuit, respectively.

S3: feedbacking the parasitic parameters of the grounding circuit mentioned in S2 into the equivalent circuit model after the assembled FBAR filter mentioned in S1 and obtaining the S parameter of the FBAR filter by using a circuit simulation software.

S4: adjusting the parasitic parameters of the grounding circuit to optimize the S parameter of the FBAR filter.

S5: obtaining an optimal assembly configuration of the FBAR filter by comparing S parameter performances the FBAR filter with different assembly configurations to guide an assembly of the FBAR filter.

In some embodiments, the S parameter includes an out-band suppression and a passband bandwidth of the FBAR filter.

In some embodiments, a parasitic capacitance and parasitic inductance of the grounding pad are fixed. A parasitic inductance of the grounding bond-wire may be adjusted by changing a material, diameter, quantity, bonding arc and other parameters of the grounding bond-wire. The parasitic inductances under different assembly configuration is brought into the equivalent circuit of the filter to obtain the out-band suppression and the passband bandwidth of the filter through simulation, and then an optimal assembly configuration of the filter is obtained by comparing the obtained performance of the filter, thereby shortening an adjusting time of the FBAR filter, which can guide an FBAR filter assembly and improve an FBAR filter assembly efficiency.

In some embodiments, the parasitic capacitance of the grounding pad is calculated by using a parallel plate capacitance formula.

In some embodiments, a resonant frequency of the grounding pad is obtained by using a 3D electromagnetic simulation software (HFSS) to model and simulate the grounding pad.

In some embodiments, the parasitic capacitance of the grounding pad obtained by the calculation and the resonant frequency obtained by a simulation are used to calculate the parasitic inductance of the grounding pad by using an LC resonant frequency calculation formula, The LC resonant frequency calculation formula is $f=1/2\pi\sqrt{L \cdot C}$, where f for the resonant frequency in Hertz (Hz), L for the parasitic inductance of the grounding pad in Henry (H), and C for the parasitic capacitance of the grounding pad in Farad (F).

In some embodiments, in order to calculate the parasitic inductance of the grounding bond-wire, the 3D electromagnetic simulation model of the grounding circuit is constructed by using the 3D electromagnetic simulation software (HFSS) and a resonant frequency of the grounding circuit ($f_0$) is obtained by an electromagnetic simulation model. In the other hand, an equivalent calculation model of grounding circuit is constructed in the circuit simulation software (ADS). The parasitic capacitance of the grounding pad, the parasitic inductance of the grounding pad and an initial value parasitic inductance of the grounding bond-wire are input into the equivalent calculation model, and another resonant frequency of the grounding circuit ($f_1$) is obtained by the equivalent calculation model. Then, the parasitic inductance of the grounding bond-wire in the equivalent calculation model is adjusted to make $f_1$ gradually approach $f_0$. When a difference between $f_1$ and $f_0$ converges to a preset precision value (For example, the difference between the two resonant frequencies is less than 1 kHz), a corresponding inductance of the equivalent calculation model is the parasitic inductance of the grounding bond-wire.

In this embodiment, the grounding pad and a silicon-based substrate are connected by selecting grounding bond-wires of different numbers. For example, each additional grounding bond-wire is added in parallel, which is equivalent to increasing a diameter of the grounding bond-wire, that is, the parasitic inductance of the grounding bond-wire is changed. In some embodiments, in order to quantify the parasitic inductance, the material, size, shape, length, bonding arc and diameter of each grounding bond-wire are all the same. By adjusting the parasitic inductance of the grounding bond-wire in the above way, the FBAR filter can achieve the suppression of a specified out-band frequency or a specified relative bandwidth of the passband, so as to quickly obtain the FBAR filter assembly configuration with optimized performance indicators, which improves the assembly efficiency and the performance of the FBAR filter.

On a basis of the above-mentioned embodiments, the parasitic inductance of the grounding bond-wire may be adjusted by adjusting any one or several parameters of the grounding bond-wire of each FBAR unit, such as the number, length, diameter, bonding arc and material, so that the parasitic inductance of the FBAR filter may be adjusted. The FBAR unit is a film bulk acoustic resonator as showed in FIG. 3-a.

For example, if the parameters such as the number, length, bonding arc, and diameter of the grounding bond-wires remain unchanged, the grounding bond-wires with different materials can be selected to adjust the parasitic inductance of the grounding bond-wires of a FBAR unit. For another example, if the parameters such as the number, length, bonding arc, and material of the grounding bond-wires remain unchanged, the grounding bond-wires with different diameters can be selected to adjust the parasitic inductance of the grounding bond-wires of the FBAR unit. For another example, if the parameters such as the number, diameter, bonding arc, and material of the grounding bond-wires remain unchanged, the grounding bond-wires with different lengths can be selected to adjust the parasitic inductance of the grounding bond-wires of the FBAR unit. Alternatively, various parameters of the grounding bond-wire such as the number and length, or the number and diameter, or the number and material, or the bonding arc and number, or the bonding arc and diameter, or the length, number and diameter of each of the FBAR units may be adjusted to adjust the parasitic inductance of the grounding bond-wire to enable the resonant frequency of the grounding circuit ($f_1$) obtained by the equivalent calculation model in the circuit simulation software to gradually approach the resonant frequency of the grounding circuit ($f_0$) obtained by the electromagnetic simulation model in the 3D electromagnetic simulation software. When the difference between $f_1$ and $f_0$ converges to the preset precision value, the parasitic inductance of the grounding bond-wire is obtained. In a word, through controlling various parameters of the grounding bond-wire, the parasitic inductance of the grounding bond-wire can be adjusted more accurately.

Please refer to FIG. 2. The embodiment provides a typical FBAR filter chip based on a ladder topology, which includes electrodes, piezoelectric film resonators and a silicon-based substrate. Resonators in parallel of the FBAR filter are connected to a ground by the grounding bond-wire. The equivalent model of the grounding pad is a resistance, a capacitance and an inductance in series, and the equivalent model of the grounding bond-wire is a resistance and an inductance in series, which will not be repeated here. Additionally, in addition to the traditional ladder topology, the FBAR filter chip may also use other topology.

In some other embodiments, the FBAR filter includes a signal input terminal $RF_{in}$ (RF input), a signal output terminal $RF_{out}$ (RF output), nodes $N_1$ to $N_{m+1}$, and m FBAR units in series and n FBAR units in parallel. The FBAR units in serial and the FBAR units in parallel are interconnected in sequence. Wherein, m is a positive integer greater than n. The FBAR unit includes a supporting layer, a bottom electrode, a piezoelectric layer, and a top electrode, which are sequentially deposited on the substrate from bottom to top. The node between the signal input terminal $RF_{in}$ and a first FBAR unit in serial is node $N_1$, and the node between the m-th FBAR unit in serial and the signal output terminal $RF_{out}$ is node $N_{m+1}$. Each node between the second node and the m-th node (including the second node and the m-th node) may be connected with one end of each FBAR unit in parallel, and the other end of each FBAR in parallel unit is grounded through the grounding bond-wire.

In some embodiments, a material of the bottom electrode is Pt. A material of the piezoelectric layer is AlN. A material of the top electrode is Al. A material of one supporting layer is $SiO_2$. And a material of another supporting layer is $Si_3N_4$. In the FBAR filter, a thickness of the supporting layer of $SiO_2$ is 300 nm, a thickness of the supporting layer of $Si_3N_4$ is 200 nm, a thickness of the bottom electrode is 80 nm, and a thickness of the piezoelectric layer is 1 μm.

For example, please refer to FIG. 3-a, the number m of the FBAR units in series is 5, and the number n of FBAR units in parallel is 4. Please refer to FIG. 3-b, since the parasitic resistance of the grounding circuit is very small and hardly affect a frequency response performance of the FBAR filter. In this case, through ignoring an influence of the resistance, the equivalent circuit model of the parasitic parameters includes the parasitic capacitance of the grounding pad ($C_P$)

and parasitic inductance of the grounding pad ($L_P$) in series, and the parasitic inductance of the grounding bond-wire ($L_W$) in parallel.

Please refer to FIG. 4-a. A standard bond-wire model in HFSS is used. The parasitic parameters are extracted. For example, the parasitic capacitance of the grounding pad may be calculated by the parallel plate capacitance formula. For example, the parasitic inductance of the grounding pad is calculated by the parasitic capacitance of the grounding pad and the resonant frequency obtained by the simulation, using the LC resonant frequency calculation formula. The resonant frequency is obtained by the simulation calculation with the HFSS simulation software. For example, the grounding bond-wire is in a trapezoid shape after connected with the grounding pad and the substrate, and the model of the grounding bond-wire adopts a 4-point standard model obtained by the HFSS simulation software. Dimensions of the grounding bond-wire are as follows: $h_1$=0.1 mm, $h_2$=0.35 mm, D=0.7 mm, $\phi$=0.025 mm, and a distance between two adjacent grounding bond-wires is 0.06 mm.

It is necessary to study an influence of the parasitic inductance on electrical properties of the FBAR filter when different numbers of bond-wires are grounded, for example, using one, two or three grounding bond-wires on the grounding pads of different FBAR units, respectively. For example, please refer to FIG. 4-b, which is a model with one bond-wire on each grounding pad. Please refer to FIG. 4-c, which is a model with two bond-wires on each grounding pad. Please refer to FIG. 4-d, which is a model with three bond-wires on each grounding pad. The pads in the middle with only one bond-wire in these models is RF transmission pads, which will not affect a grounding performance of the FBAR filter. In the above embodiment, an area of a single grounding pad is 0.0844 mm². Through the simulation and calculation, the parasitic capacitance ($C_P$) and parasitic inductance ($L_P$) of the grounding pad are obtained ($C_P$=0.0254 pF, $L_P$=0.337 nH). In order to extract the parasitic inductance of the grounding bond-wire ($L_W$), different grounding mode models shown in FIG. 4-b, FIG. 4-c and FIG. 4-d are simulated in HFSS, and the resonant frequencies of the grounding circuit under different grounding assembly configurations are obtained. Next, a parasitic parameter model equivalent to that in FIG. 3-c is created by the ADS software, and the parasitic parameters ($C_P$ and $L_P$) obtained from the HFSS simulation are brought into the parasitic parameter model. By changing the parasitic inductance of the grounding bond-wire ($L_W$), the resonant frequency obtained in ADS gradually approaches the simulated resonant frequency obtained in HFSS. Finally, when the difference between the two resonant frequencies converges to the preset precision value (for example, the difference between the two resonant frequencies is less than 1 kHz), the respective parasitic parameters $L_W$ with different number of grounding bond-wires are determined.

Table 1 shows results of the parasitic inductance with different number of grounding bond-wires. The parasitic inductance decreases as the number of grounding bond-wires on each pad increases.

TABLE 1

| Number of grounding bond-wires | Resonant frequency (GHz) | Parasitic inductance $L_w$ (nH) |
| --- | --- | --- |
| 1 | 36.69 | 0.401 |
| 2 | 41.85 | 0.232 |
| 3 | 44.25 | 0.172 |

Figure 5:
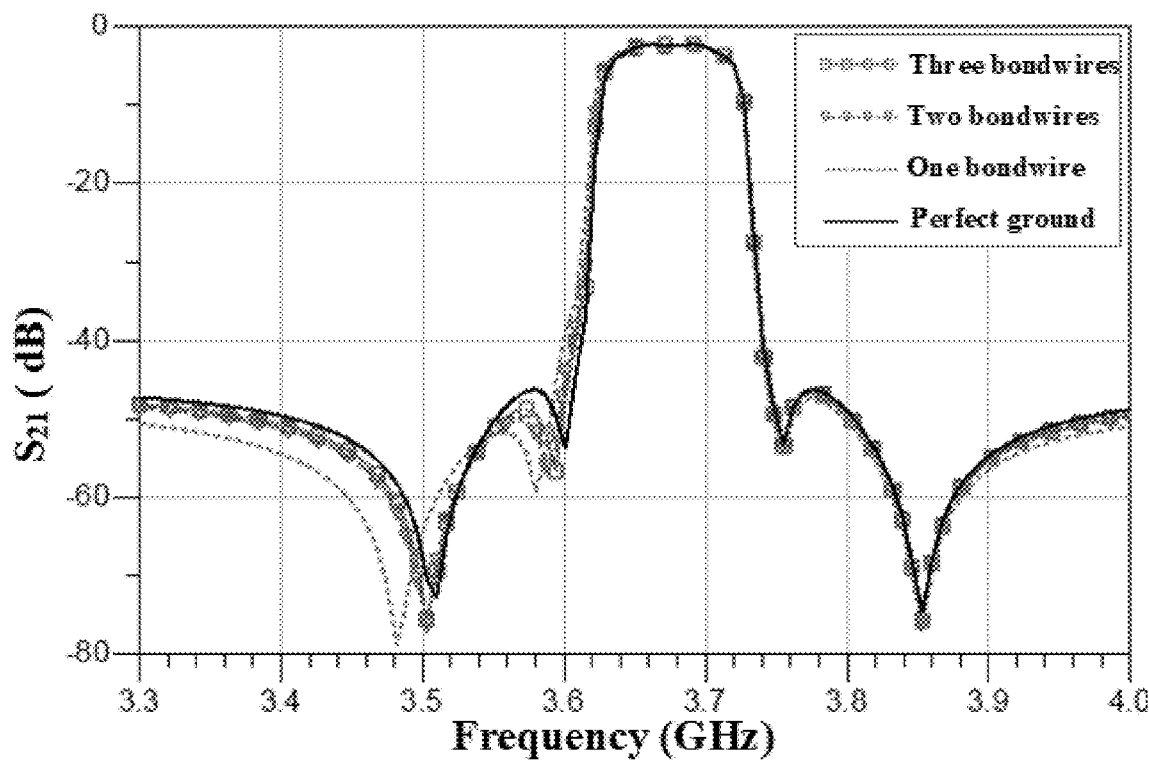
FIG. 5 is simulated S parameter results of the FBAR filter connecting with different grounding bond-wires according to an embodiment of the disclosure.

Please refer to FIG. 5. The embodiment provides simulated S parameter results of the FBAR filters with different grounding configurations. For filters with perfect grounding that means the filter chip's grounding pads are directly grounded without the bond-wires, a first transmission zero frequency (which means the transmission zero closest to a center frequency in a low frequency band of the filter) is about 3.60 GHz, and the second transmission zero frequency is about 3.52 GHz. For the filters grounded as shown in FIG. 4-b, FIG. 4-c and FIG. 4-d, the first transmission zero frequencies are 3.58 GHz, 3.59 GHz and 3.595 GHz, respectively. And the second transmission zero frequencies are 3.48 GHz, 3.505 GHz and 3.508 GHz, respectively. It can be understood from the above that as the number of bond-wires increases (which means the parasitic inductance $L_W$ decreases), a transmission zero at a low frequency edge moves to a higher frequency.

Figure 6:
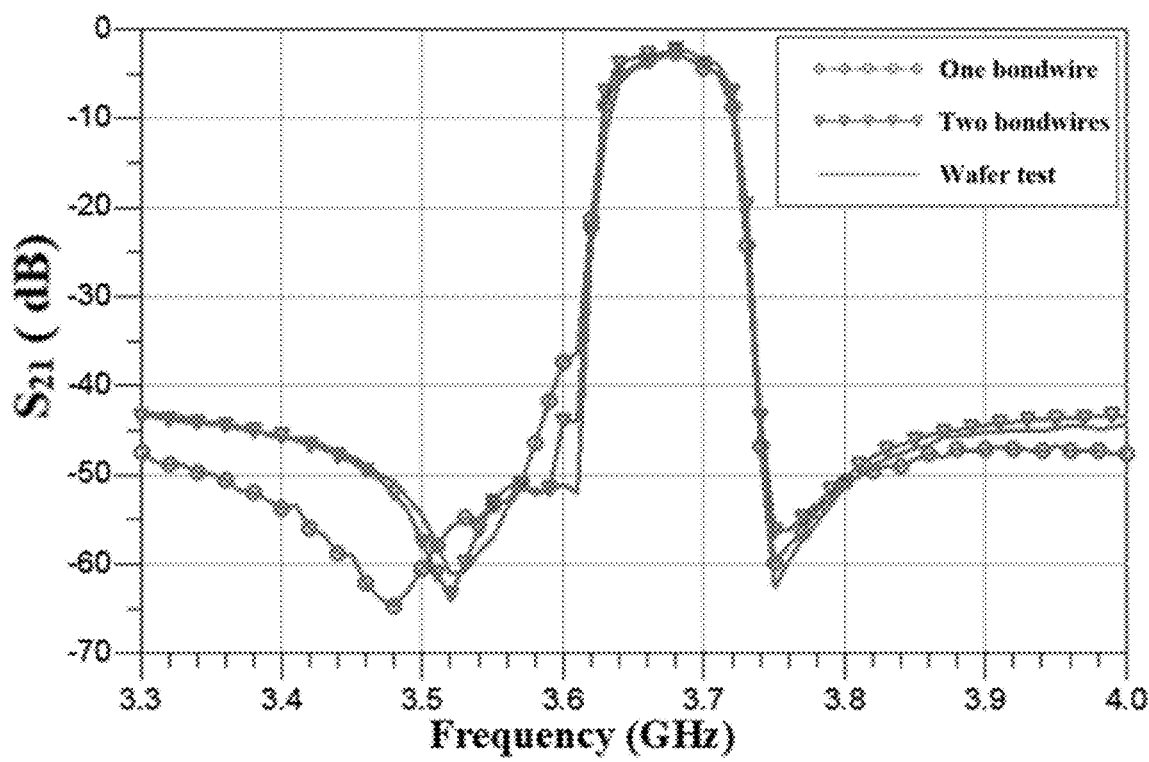
FIG. 6 is measured S parameter results of the FBAR filter connecting with different grounding bond-wires according to the embodiment of the disclosure.

Please refer to FIG. 6. The embodiment provides measured S parameter results of FBAR filters with different grounding configurations. Two assembled FBAR filter samples have one grounding bond-wire and two grounding bond-wires bonded on each grounding pad, respectively. Measurement results also include on-wafer test data of the filter chip, which is obtained by using a pair of GSG probes to test on the filter chip. The measurement results of curves show that as the number of the grounding bond-wires increases, the transmission zero of the filter at the low frequency edge shifts to the higher frequency, which is consistent with the simulation results in FIG. 5.

With the above embodiments, the disclosure further provides an electronic device (eg, an electronic component). The electronic device includes: the FBAR filter including the FBAR filter chip and the grounding circuit obtained by using the above-mentioned FBAR filter assembling and interconnecting method.

In summary, the disclosure establishes the equivalent model of the FBAR filter with regard to the parasitic inductance and the parasitic capacitance. Through simulating the filters with different configurations of the grounding bond-wires, the parasitic inductance of the grounding bond-wire is adjusted, so that the FBAR filter can achieve the specified out-band suppression or the optimization of the passband bandwidth, and quickly obtain the specified performance of the FBAR filter, which improves the assembling efficiency of the FBAR filter. In addition, in the performance simulation work of FBAR filter, it provides an important theoretical basis for the realization of the device assembly.

The above-mentioned embodiments merely illustrate the principles and effects of the disclosure, but they are not intended to limit the disclosure. Anyone skilled in the art may modify or change the above embodiments without departing from the range of the disclosure. Therefore, all equivalent modifications or changes made by those with ordinary knowledge in the technical field without departing from the range and technical disclosed in the disclosure should still be covered by the claims of the disclosure.

What is claimed is:

1. A method for assembling and interconnecting a film bulk acoustic resonator (FBAR) filter, comprising:
constructing an equivalent circuit model of an assembled FBAR filter according to a circuit model of a filter chip of the FBAR filter and a grounding circuit of the FBAR filter, wherein
the circuit model of the filter chip is simulated by a plurality of film bulk acoustic resonators in different architecture configurations, the grounding circuit of the FBAR filter comprises a parasitic capacitor of a grounding pad on a surface of the filter chip, a parasitic inductor of the grounding pad on the surface of the filter chip and a parasitic inductor of a grounding bond-wire, each grounding circuit of the plurality of film bulk acoustic resonators are of the same structure, and the grounding circuit is formed by connecting the parasitic capacitor and the parasitic inductor of the grounding pad in series and then to be connected in parallel with the parasitic inductor of the grounding bond-wire;

modeling, simulating and calculating the grounding circuit of the FBAR filter to extract parasitic parameters corresponding to the grounding pad and the grounding bond-wire of the grounding circuit, respectively;

feedbacking the parasitic parameters of the grounding circuit into the equivalent circuit model of the assembled FBAR filter and obtaining an S parameter of the FBAR filter by using a circuit simulation software;

adjusting the parasitic parameters of the grounding circuit to optimize an S parameter performance of the FBAR filter, and obtaining an optimal assembly configuration of the FBAR filter by comparing S parameter performances of the FBAR filter with different assembly configurations to guide an assembly of the FBAR filter.

2. The method for assembling and interconnecting the FBAR filter according to claim 1, further comprising:
calculating a parasitic capacitance of the grounding pad by using a parallel plate capacitance formula.

3. The method for assembling and interconnecting the FBAR filter according to claim 1, further comprising:
obtaining a resonant frequency of the grounding pad by using a 3D electromagnetic simulation software to model and simulate the grounding pad.

4. The method for assembling and interconnecting the FBAR filter according to claim 1, further comprising:
using a parasitic capacitance of the grounding pad and a resonant frequency of the grounding pad to calculate a parasitic inductance of the grounding pad by
an LC resonant frequency calculation formula that is $$f = \frac{1}{2\pi\sqrt{L \cdot C}},$$

where f for the resonant frequency in Hertz (Hz), L for the parasitic inductance of the grounding pad in Henry (H), C for the parasitic capacitance of the grounding pad in Farad (F).

5. The method for assembling and interconnecting the FBAR filter according to claim 1, further comprising:
constructing a 3D electromagnetic simulation model of the grounding circuit by using a 3D electromagnetic simulation software, obtaining a resonant frequency of the grounding circuit ($f_0$) by an electromagnetic simulation, constructing an equivalent calculation model of grounding circuit by using the circuit simulation software, inputting a parasitic capacitance of the grounding pad and a parasitic inductance of the grounding pad and an initial value parasitic inductance of the grounding bond-wire into the equivalent calculation model, and obtaining another resonant frequency of the grounding circuit ($f_1$) by the equivalent calculation model, then adjusting a parasitic inductance of the grounding bond-wire in the equivalent calculation model to make $f_1$ gradually approach $f_0$, when a difference between $f_1$ and $f_0$ converges to a preset precision value, a corresponding inductance in the equivalent calculation model is the parasitic inductance of the grounding bond-wire.

6. The method for assembling and interconnecting the FBAR filter according to claim 1, further comprising:
a parasitic capacitance and inductance of the grounding pad are adjusted by changing a design of the grounding pad of the FBAR filter, and a parasitic inductance of the grounding bond-wire is adjusted by changing one or more parameters of the bond-wire comprising material, diameter, quantity and bonding arc.

7. The method for assembling and interconnecting the FBAR filter according to claim 1, wherein
the S parameter comprises an out-band suppression and a passband bandwidth of the FBAR filter.

8. The method for assembling and interconnecting the FBAR filter according to claim 7, wherein
a parasitic inductance of the grounding bond-wire gradually decreases as a quantity of the grounding bond-wire increases, and a transmission zero or the passband bandwidth of the FBAR filter changes.

9. An electronic device, comprising:
the FBAR filter including the FBAR filter chip and the grounding circuit, manufactured through method according to claim 1.

* * * * *